(12) United States Patent
Qin

(10) Patent No.: US 8,895,428 B2
(45) Date of Patent: Nov. 25, 2014

(54) MANUFACTURE METHOD OF THIN FILM TRANSISTOR ARRAY SUBSTRATE

(75) Inventor: Shijian Qin, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 201 days.

(21) Appl. No.: 13/503,650

(22) PCT Filed: Feb. 10, 2012

(86) PCT No.: PCT/CN2012/071005
§ 371 (c)(1),
(2), (4) Date: Apr. 23, 2012

(87) PCT Pub. No.: WO2013/117004
PCT Pub. Date: Aug. 15, 2013

(65) Prior Publication Data
US 2013/0203196 A1    Aug. 8, 2013

(30) Foreign Application Priority Data
Feb. 7, 2012 (CN) .......................... 2012 1 0026475

(51) Int. Cl.
*H01L 21/44* (2006.01)

(52) U.S. Cl.
USPC ........... 438/609; 438/597; 438/607; 438/608; 257/72

(58) Field of Classification Search
USPC ................... 438/597, 607, 608, 609; 257/72
See application file for complete search history.

(56) References Cited

U.S. PATENT DOCUMENTS

| | | | |
|---|---|---|---|
| 6,744,482 B2 * | 6/2004 | Matsumoto et al. | 349/141 |
| 6,816,222 B2 * | 11/2004 | Ono et al. | 349/143 |
| 6,900,872 B2 * | 5/2005 | Kang | 349/141 |
| 7,180,559 B2 * | 2/2007 | Chang et al. | 349/106 |
| 7,599,032 B2 * | 10/2009 | Chang et al. | 349/141 |
| 7,727,789 B2 * | 6/2010 | Chen et al. | 438/30 |
| 8,563,341 B2 * | 10/2013 | Jia et al. | 438/30 |
| 8,654,296 B2 * | 2/2014 | Li et al. | 349/141 |
| 2004/0080700 A1 * | 4/2004 | Kang | 349/141 |
| 2007/0109455 A1 * | 5/2007 | Kim et al. | 349/43 |

* cited by examiner

*Primary Examiner* — Nicholas Tobergte

(57) ABSTRACT

Disclosed is a manufacture method of the thin film transistor array, comprising depositing a first transparent conductive layer and a first metal layer to perform patterning for forming a common electrode, a gate electrode and a transparent electrode array; depositing an insulating layer, an active layer, an ohmic contact layer and a second metal layer to perform patterning for forming a source and a drain; depositing a second transparent conductive layer to perform patterning for forming a source contact layer, a drain contact layer and a pixel electrode array connected to the drain contact layer. The present invention simplifies the manufacture process, saves the cost and time for the manufacture.

15 Claims, 6 Drawing Sheets

MANUFACTURE METHOD OF THIN FILM TRANSISTOR ARRAY SUBSTRATE

BACKGROUND OF THE INVENTION

1. Field of the Invention

The present invention generally relates to a semiconductor manufacture field, and more particularly to a manufacture method of a thin film transistor array substrate.

2. Description of Prior Art

LCD (Liquid crystal display) panel is one of the main components of a LCD. The present TFT-LCD panel provides advantages of low power consumption, small size structure and no radiation and therefore is widely applied in a liquid crystal display.

TFT-LCD comprises a thin film transistor array substrate and a color film substrate which the liquid crystal is positioned therebetween. Mainly, the manufacture of the thin film transistor array substrate is proceeded by performing photo-mask processes to form the necessary patterns for forming thin film transistor elements and the corresponding layout. Several photo-mask processes are required to complete the manufacture of the thin film transistor array substrate because the thin film transistor elements and layout on the glass substrate comprises multiple layers. Through developments and improvements of the technologies, a skill of forming an IPS (In-Plane switching) type LCD with four photo-mask processes has been proposed and achieved today.

FIG. 1 depicts a planar construction diagram of a thin film transistor array substrate of an IPS type LCD according to prior art. FIG. 2 depicts a sectional view diagram along the III-III' line and the IV-IV' line shown in FIG. 1.

Please refer to FIG. 1 and FIG. 2 for illustrating the skill of forming an IPS (In-Plane switching) type LCD with four photo-mask processes. First, a conductive metal layer is deposited on a lower substrate 80 and a scan line 81 and a gate electrode 81a is formed by performing patterning to the conductive metal layer. A common line 81b is formed at the same time as the scan line 81 is formed. Multiple transparent electrodes 81c are connected to the common line 81b. After that, an insulating layer 82 is deposited over the entire surface of the lower substrate 80 comprising the scan line 81. A semiconductive layer is formed on the insulating layer 82 and then patterning is performed to form an active layer 83 on the gate electrode 81a. Then, another conductive metal layer is deposited over the entire surface of the lower substrate 80 which the active layer 83 has been formed thereon and then patterning is performed to form data lines 84_1, 84_2, 84_3 and 84_4. Meanwhile, a source 84a and a drain 84b are formed at the same time. A protective layer 85 is deposited over the entire surface of the lower substrate 80 and a contact hole is configurated to reveal the drain 84b. Last, a transparent conductive metal is deposited on the protective layer 85 and patterning is conducted to the transparent conductive metal to form a pixel electrode 87 contacting the drains 84b via the contact hole 86. At the same time while the pixel electrode 87 is formed, a storage capacitor 88 is formed on the protective layer 85 above the common line 81b.

As aforementioned, the skill of forming an IPS (In-Plane switching) type LCD with four photo-mask processes remains the complexity, the manufacture difficulty and higher manufacture cost and the manufacture difficulty level is increased. Consequently, there is a need to provide a manufacture method of a thin film transistor array substrate for solving the existing problems in prior arts.

SUMMARY OF THE INVENTION

The present invention provides a manufacture method of a thin film transistor array substrate, which merely three photo-mask processes are employed for completing the whole manufacture of the thin film transistor array substrate to simplify the manufacture process of the thin film transistor array substrate, to save the cost and time for the manufacture of the thin film transistor array substrate. The technical issues of manufacture cost increase and the manufacture time extension due to completing the whole manufacture of the thin film transistor array substrate with four photo-mask processes according to prior arts can be solved.

The present invention provides a manufacture method of a thin film transistor array substrate comprising steps of: A. depositing a first transparent conductive layer and a first metal layer sequentially to perform patterning for forming a common electrode, a gate electrode and a transparent electrode array; B. depositing an insulating layer, an active layer, an ohmic contact layer and a second metal layer sequentially to perform patterning for forming a source and a drain at two sides of the active layer; C. depositing a second transparent conductive layer to perform patterning for forming a source contact layer, a drain contact layer and a pixel electrode array connected to the drain contact layer; D. forming a protective layer on a trench surface of the active layer; the first transparent conductive layer and the first metal layer are sequentially deposited by sputtering in step A; a half tone mask is employed to perform patterning for forming the common electrode, the gate electrode and the transparent electrode array in step A; the insulating layer, the active layer, the ohmic contact layer and the second metal layer are sequentially deposited by chemical vapor deposition in step B; the second transparent conductive layer is deposited by sputtering in step C.

In the manufacture method of a thin film transistor array substrate according to the present invention, plasma is employed for a passivation process to the trench surface of the active layer for forming the protective layer in step D.

In the manufacture method of a thin film transistor array substrate according to the present invention, the first metal layer comprises an aluminum layer and a first molybdenum layer, and the second metal layer comprises the first molybdenum layer, the aluminum layer and a second molybdenum layer.

In the manufacture method of a thin film transistor array substrate according to the present invention, mixture of nitric acid, phosphoric acid and acetic acid is employed for a wet etching to the first metal layer, and oxalic acid is employed for a wet etching to the first transparent conductive layer in step A.

In the manufacture method of a thin film transistor array substrate according to the present invention, mixture of nitric acid, phosphoric acid and acetic acid is employed for a wet etching to the second metal layer, and employed for a dry etching to the insulating layer, the active layer and the ohmic contact layer in step B.

The present invention provides a manufacture method of a thin film transistor array substrate comprising steps of: A. depositing a first transparent conductive layer and a first metal layer sequentially to perform patterning for forming a common electrode, a gate electrode and a transparent electrode array; B. depositing an insulating layer, an active layer, an ohmic contact layer and a second metal layer sequentially to perform patterning for forming a source and a drain at two sides of the active layer; C. depositing a second transparent conductive layer to perform patterning for forming a source contact layer, a drain contact layer and a pixel electrode array connected to the drain contact layer; D. forming a protective layer on a trench surface of the active layer.

In the manufacture method of a thin film transistor array substrate according to the present invention, the first transparent conductive layer and the first metal layer are sequentially deposited by sputtering in step A.

In the manufacture method of a thin film transistor array substrate according to the present invention, a half tone mask is employed to perform patterning for forming the common electrode, the gate electrode and the transparent electrode array in step A.

In the manufacture method of a thin film transistor array substrate according to the present invention, the insulating layer, the active layer, the ohmic contact layer and the second metal layer are sequentially deposited by chemical vapor deposition in step B.

In the manufacture method of a thin film transistor array substrate according to the present invention, a half tone mask is employed to perform patterning for forming the source and the drain at two sides of the active layer in step B.

In the manufacture method of a thin film transistor array substrate according to the present invention, the second transparent conductive layer is deposited by sputtering in step C.

In the manufacture method of a thin film transistor array substrate according to the present invention, plasma is employed for a passivation process to the trench surface of the active layer for forming the protective layer in step D.

In the manufacture method of a thin film transistor array substrate according to the present invention, the first metal layer comprises an aluminum layer and a first molybdenum layer, and the second metal layer comprises the first molybdenum layer, the aluminum layer and a second molybdenum layer.

In the manufacture method of a thin film transistor array substrate according to the present invention, mixture of nitric acid, phosphoric acid and acetic acid is employed for a wet etching to the first metal layer, and oxalic acid is employed for a wet etching to the first transparent conductive layer in step A.

In the manufacture method of a thin film transistor array substrate according to the present invention, mixture of nitric acid, phosphoric acid and acetic acid is employed for a wet etching to the second metal layer, and employed for a dry etching to the insulating layer, the active layer and the ohmic contact layer in step B.

With the implement of the manufacture method of a thin film transistor array substrate according to the present invention, benefits described hereafter can be conducted: Merely three photo-mask processes are employed, the whole manufacture of the thin film transistor array substrate can be completed to simplify the manufacture process of the thin film transistor array substrate and to save the cost and time for the manufacture of the thin film transistor array substrate. The technical issues of manufacture cost increase and the manufacture time extension due to completing the whole manufacture of the thin film transistor array substrate with four photo-mask processes according to prior arts can be solved.

For a better understanding of the aforementioned content of the present invention, preferable embodiments are illustrated in accordance with the attached figures for further explanation. Obviously, the following figures are embodiments of the present invention. It is easy for a person skilled in the art to derive other embodiments from these figures.

DETAILED DESCRIPTION OF THE INVENTION

The following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In figures, the elements with similar structures are indicated by the same number.

Figure 1:
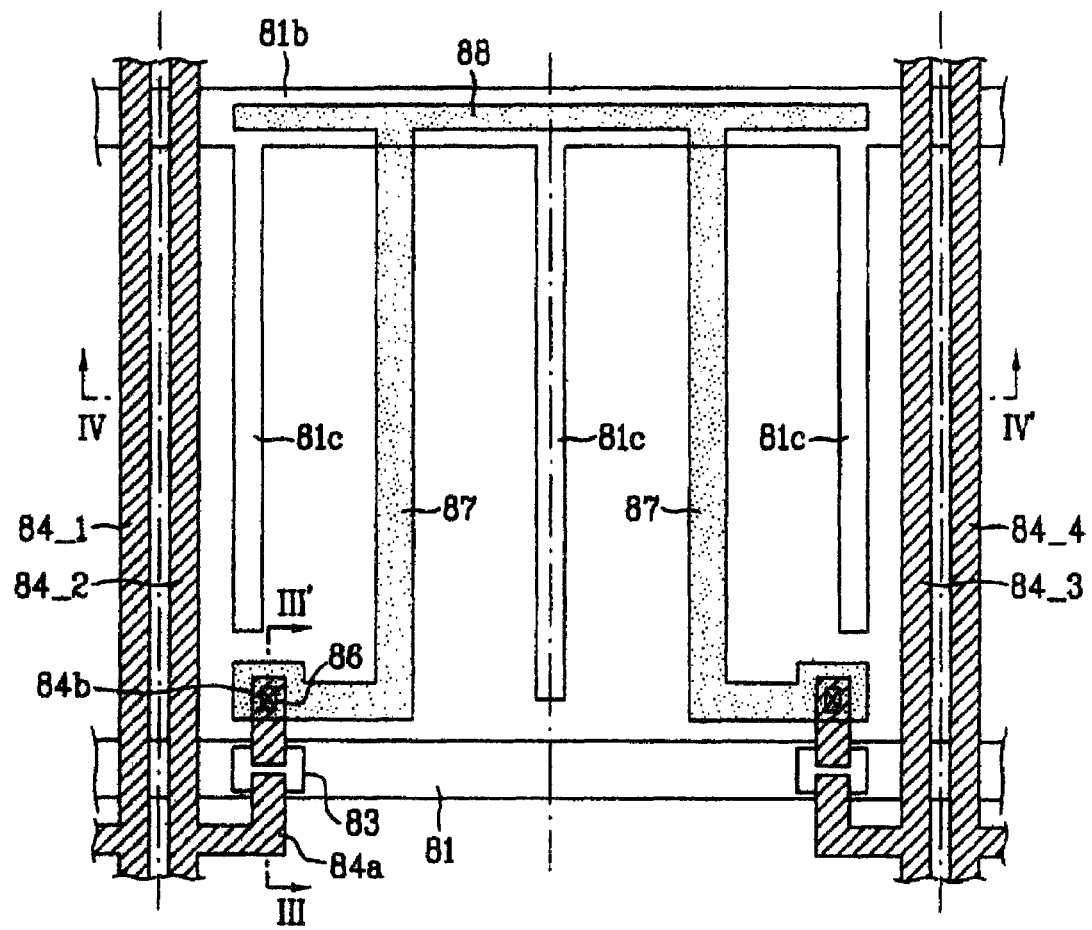
FIG. 1 depicts a planar construction diagram of a thin film transistor array substrate of an IPS type LCD according to prior art.
Figure 2:
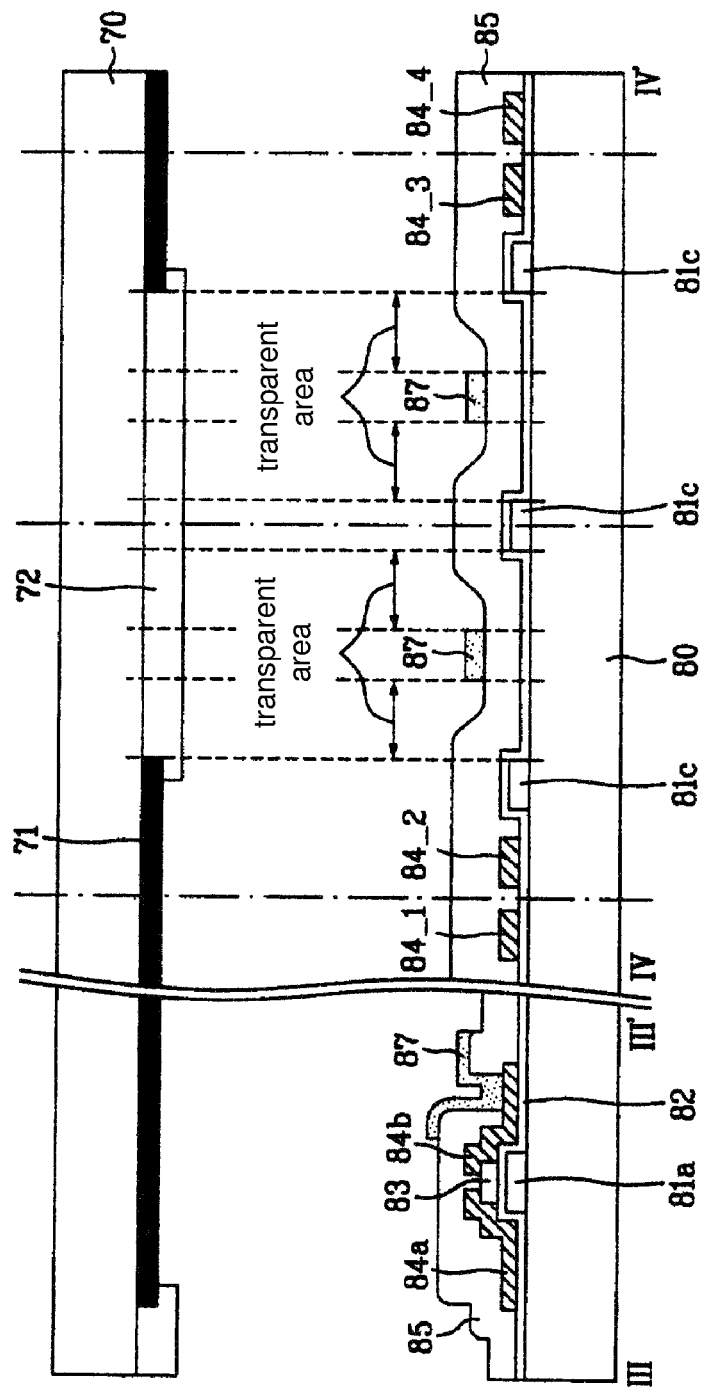
FIG. 2 depicts a sectional view diagram along the III-III' line and the IV-IV' line shown in FIG. 1.
Figure 3:
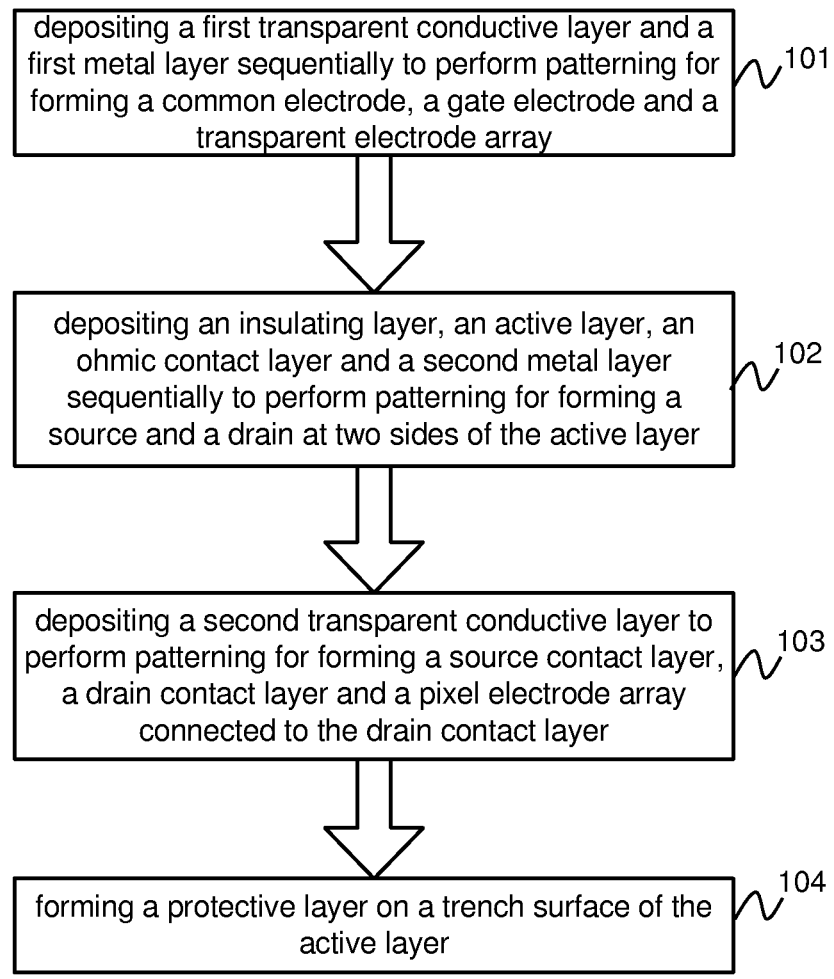
FIG. 3 depicts a flow chart of a preferable embodiment according to the manufacture method of a thin film transistor array substrate of the present invention.

The present invention is related to a manufacture method of a thin film transistor array substrate as shown in FIG. 3. FIG. 3 depicts a flow chart of a preferable embodiment according to the manufacture method of a thin film transistor array substrate of the present invention. The manufacture method of the thin film transistor comprises steps hereafter:

Step 101, depositing a first transparent conductive layer and a first metal layer sequentially to perform patterning for forming a common electrode 301, a gate electrode 302 and a transparent electrode array 201;

Step 102, depositing an insulating layer 4, an active layer 5, an ohmic contact layer 6 and a second metal layer sequentially to perform patterning for forming a source 701 and a drain 702 at two sides of the active layer 5;

Step 103, depositing a second transparent conductive layer to perform patterning for forming a source contact layer 810, a drain contact layer 802 and a pixel electrode array 803 connected to the drain contact layer 802;

Step 104, forming a protective layer 502 on a trench surface of the active layer 5.

Please refer to FIG. 4, FIG. 5A, FIG. 5B, FIG. 5C and FIG. 5D for illustrating the flow of the manufacture method of the present invention in detail.

Step 101 comprises: Step 1011, depositing the first transparent conductive layer and the first metal layer sequentially on a lower substrate 1 by sputtering, the first transparent conductive layer can be formed by a transparent and conductive metal, such as ITO (Indium Tin Oxide), TO (Oxide of Tin), IZO (Indium Zinc oxide) and ITZO (Indium Tin Zinc oxide). The first metal layer preferably comprises an aluminum layer and a first molybdenum layer.

Figure 5A:
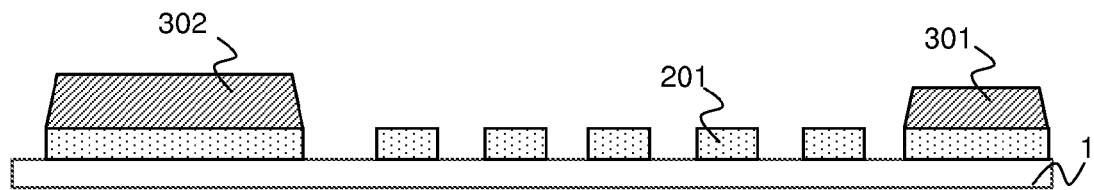
FIG. 5A to FIG. 5D depict planar construction diagrams according to a preferable embodiment according to the manufacture method of a thin film transistor array substrate of the present invention.

Step 1012, employing a half tone mask to perform patterning for forming the common electrode 301, the gate electrode 302 and the transparent electrode array 201 (simultaneously forming scan lines 303 connected to the gate electrode 302). The common electrode 301 is connected to the transparent electrode array 201. The common electrode 301 and the gate electrode 302 are formed on the first metal layer. The transparent electrode array 201 is formed on the first transparent conductive layer. The half tone mask is employed to expose the gate electrode 302, the common electrode 301, the transparent electrode array 201 and the rest part of the lower substrate 1 in different levels. Then, the mixture of nitric acid, phosphoric acid and acetic acid is employed for a wet etching to the first metal layer to form the gate electrode 302 and the common electrode 301. The oxalic acid is employed for a wet etching to the first transparent conductive layer to form transparent electrode array 201. The appearance of the thin film transistor array after performing patterning is shown in FIG. 5A.

Step 102 comprises:

Step 1021, depositing the insulating layer 4, the active layer 5, the ohmic contact layer 6 and the second metal layer sequentially by chemical vapor deposition, the second metal layer preferably comprises a first molybdenum layer, an aluminum layer and a second molybdenum layer.

Figure 5B:
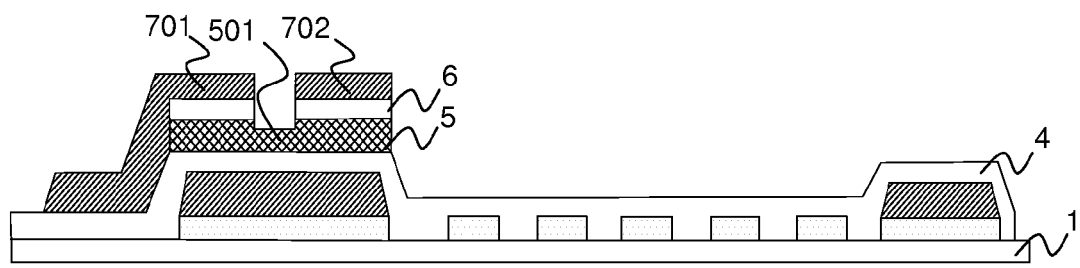

Step 1022, employing a half tone mask to perform patterning for forming the source 701 and the drain 702 at two sides of the active layer 5 (simultaneously forming data lines 703 connected to the source 701). The source 701 and the drain 702 are formed on the ohmic contact layer 6. The half tone mask is employed to expose the source 701, the drain 702, a trench 501 of the active layer 5 and the rest part in different levels. Then, the mixture of nitric acid, phosphoric acid and acetic acid is employed for a wet etching to the second metal layer. Afterwards, RIE (Reactive Ion Etching) or other etching method is employed for a dry etching to the insulating layer 4, the active layer 5 and the ohmic contact layer 6 for forming the source 701 and the drain 702 and revealing the trench 501 of the active layer 5. The appearance of the thin film transistor array after performing patterning is shown in FIG. 5B.

Step 103 comprises:

Step 1031, depositing the second transparent conductive layer and the second transparent conductive layer on a lower substrate 1 by sputtering, the second transparent conductive layer can be formed by a transparent and conductive metal, such as ITO (Indium Tin Oxide), TO (Oxide of Tin), IZO (Indium Zinc oxide) and ITZO (Indium Tin Zinc oxide).

Figure 4:
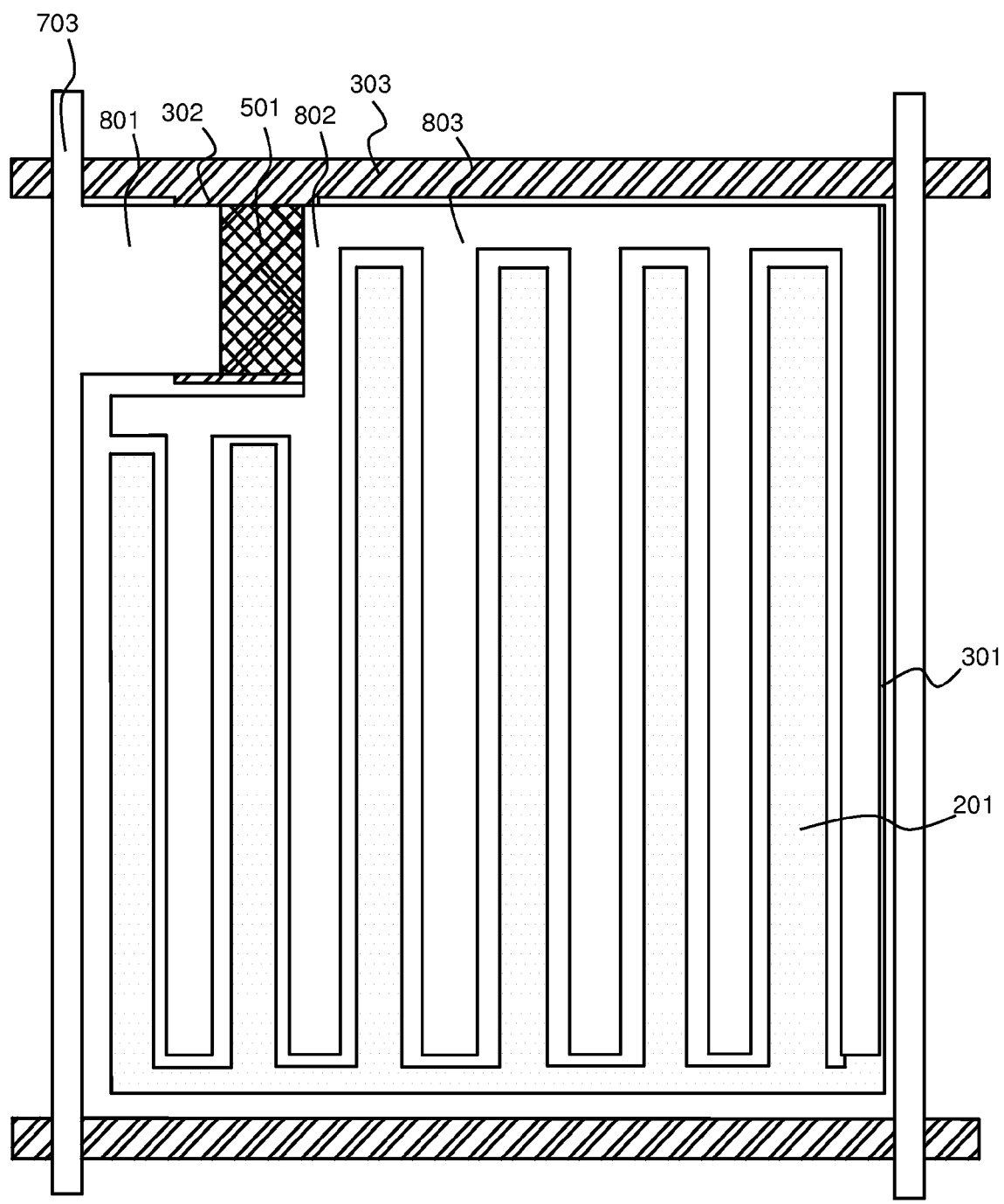
FIG. 4 depicts a planar construction diagram of a thin film transistor array substrate according to the manufacture method of the present invention.
Figure 5C:
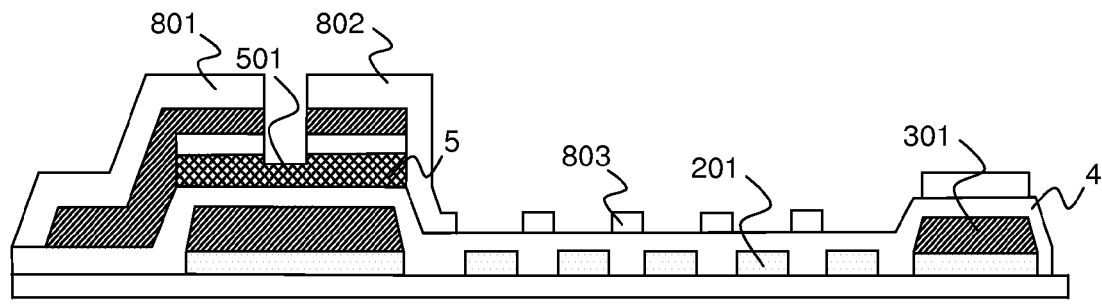

Step 1032, performing patterning to form the source contact layer 810, the drain contact layer 802 and the pixel electrode array 803 connected to the drain contact layer 802, a half tone mask can be employed to expose the pixel electrode array 803 and non-pixel electrode array area in different levels. Then, the oxalic acid is employed for an etching to the second transparent conductive layer for forming the source contact layer 810, the drain contact layer 802 and the pixel electrode array 803. The appearance of the thin film transistor array after performing patterning is shown in FIG. 4 and FIG. 5C. The transparent electrode array 201 and the pixel electrode array 803 are separated by the insulating layer 4. Meanwhile, the right side of the pixel electrode array 803 shown in figures can form a storage capacitor of the thin film transistor array substrate with the common electrode 301.

Figure 5D:
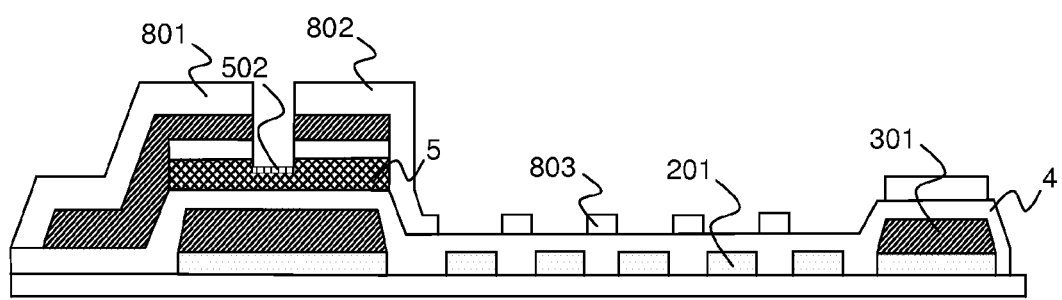

Specifically, plasma is employed for a passivation process to the surface of the trench 501 for forming a protective layer 502 on the trench 501 surface of the active layer 5. The appearance of the thin film transistor array after performing passivation is shown in FIG. 5D.

In the manufacture method of a thin film transistor array substrate according to the present invention, the active layer 5, the source 701 and the drain 702 can be formed by a single photo-mask process which is applied in the manufacture of the IPS type wide viewing angle LCD. Merely three photo-mask processes are employed, the whole manufacture of the thin film transistor array substrate can be completed to simplify the manufacture process and to save the cost and time for the manufacture. The technical issues of manufacture cost increase and the manufacture time extension due to completing the whole manufacture of the thin film transistor array substrate with four photo-mask processes according to prior arts is outstandingly solved.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A manufacture method of a thin film transistor array substrate, comprising steps of:
   A. depositing a first transparent conductive layer and a first metal layer sequentially to perform patterning for forming a common electrode, a gate electrode and a transparent electrode array;
   B. depositing an insulating layer, an active layer, an ohmic contact layer and a second metal layer sequentially to perform patterning for forming a source and a drain at two sides of the active layer;
   C. depositing a second transparent conductive layer to perform patterning for forming a source contact layer, a drain contact layer and a pixel electrode array connected to the drain contact layer;
   D. forming a protective layer on a trench surface of the active layer;
   the first transparent conductive layer and the first metal layer are sequentially deposited by sputtering in step A;
   a half tone mask is employed to perform patterning for forming the common electrode, the gate electrode and the transparent electrode array in step A;
   the insulating layer, the active layer, the ohmic contact layer and the second metal layer are sequentially deposited by chemical vapor deposition in step B;
   the second transparent conductive layer is deposited by sputtering in step C.

2. The manufacture method of the thin film transistor array substrate according to claim 1, characterized in that plasma is employed for a passivation process to the trench surface of the active layer for forming the protective layer in step D.

3. The manufacture method of the thin film transistor array substrate according to claim 1, characterized in that the first metal layer comprises an aluminum layer and a first molybdenum layer, and the second metal layer comprises the first molybdenum layer, the aluminum layer and a second molybdenum layer.

4. The manufacture method of the thin film transistor array substrate according to one of claim 1, characterized in that mixture of nitric acid, phosphoric acid and acetic acid is employed for a wet etching to the first metal layer, and oxalic acid is employed for a wet etching to the first transparent conductive layer in step A.

5. The manufacture method of the thin film transistor array substrate according to claim 1, characterized in that mixture of nitric acid, phosphoric acid and acetic acid is employed for a wet etching to the second metal layer, and employed for a dry etching to the insulating layer, the active layer and the ohmic contact layer in step B.

6. A manufacture method of a thin film transistor array substrate, comprising steps of:
   A. depositing a first transparent conductive layer and a first metal layer sequentially to perform patterning for forming a common electrode, a gate electrode and a transparent electrode array;

B. depositing an insulating layer, an active layer, an ohmic contact layer and a second metal layer sequentially to perform patterning for forming a source and a drain at two sides of the active layer;

C. depositing a second transparent conductive layer to perform patterning for forming a source contact layer, a drain contact layer and a pixel electrode array connected to the drain contact layer;

D. forming a protective layer on a trench surface of the active layer.

7. The manufacture method of the thin film transistor array substrate according to claim 6, characterized in that the first transparent conductive layer and the first metal layer are sequentially deposited by sputtering in step A.

8. The manufacture method of the thin film transistor array substrate according to claim 6, characterized in that a half tone mask is employed to perform patterning for forming the common electrode, the gate electrode and the transparent electrode array in step A.

9. The manufacture method of the thin film transistor array substrate according to claim 8, characterized in that the insulating layer, the active layer, the ohmic contact layer and the second metal layer are sequentially deposited by chemical vapor deposition in step B.

10. The manufacture method of the thin film transistor array substrate according to claim 6, characterized in that a half tone mask is employed to perform patterning for forming the source and the drain at two sides of the active layer in step B.

11. The manufacture method of the thin film transistor array according to 6, characterized in that the second transparent conductive layer is deposited by sputtering in step C.

12. The manufacture method of the thin film transistor array according to claim 6, characterized in that plasma is employed for a passivation process to the trench surface of the active layer for forming the protective layer in step D.

13. The manufacture method of the thin film transistor array according to claim 6, characterized in that the first metal layer comprises an aluminum layer and a first molybdenum layer, and the second metal layer comprises the first molybdenum layer, the aluminum layer and a second molybdenum layer.

14. The manufacture method of the thin film transistor array according to claim 8, characterized in that mixture of nitric acid, phosphoric acid and acetic acid is employed for a wet etching to the first metal layer, and oxalic acid is employed for a wet etching to the first transparent conductive layer in step A.

15. The manufacture method of the thin film transistor array according to claim 10, characterized in that mixture of nitric acid, phosphoric acid and acetic acid is employed for a wet etching to the second metal layer, and employed for a dry etching to the insulating layer, the active layer and the ohmic contact layer in step B.

* * * * *